United States Patent

[11] 3,602,743

[72] Inventor Earl L. De Shazo, Jr.
Bartlesville, Okla.

[21] Appl. No. 814,554
[22] Filed Apr. 9, 1969
[45] Patented Aug. 31, 1971
[73] Assignee Phillips Petroleum Company

[54] CIRCUIT FOR PRODUCING AN OUTPUT PULSE OF PREDETERMINED WIDTH AFTER A PREDETERMINED DELAY
3 Claims, 2 Drawing Figs.

[52] U.S. Cl. 307/293, 307/265, 307/273
[51] Int. Cl. H03k 17/28, H03k 1/18
[50] Field of Search 307/265, 273, 293; 328/55, 58, 207

[56] References Cited

UNITED STATES PATENTS

| | | | |
|---|---|---|---|
| 3,193,701 | 7/1965 | Lawhon | 307/293 X |
| 3,304,443 | 2/1967 | Sheahan et al. | 307/273 |
| 3,426,218 | 2/1969 | Baynard, Jr. | 307/265 |

*Primary Examiner*—Stanley D. Miller, Jr.
*Attorney*—Young and Quigg

ABSTRACT: A pulse delay circuit has two gate circuits cooperating with two resistance-capacitance units, one of which controls the delay interval and the other of which controls the width of the output pulse.

PATENTED AUG 31 1971 3,602,743

INVENTOR.
E.L. DE SHAZO, JR.

BY Young & Quigg
ATTORNEYS

CIRCUIT FOR PRODUCING AN OUTPUT PULSE OF PREDETERMINED WIDTH AFTER A PREDETERMINED DELAY

BACKGROUND OF THE INVENTION

In various electronic circuits, particularly those incorporated in digital computers, there is a need for a circuit which produces a pulse of predetermined width a specified time after the generation of an input pulse or a predetermined time after a switch operation.

While circuits to accomplish this purpose have heretofore been proposed and used, they have required expensive components, such as mercury delay lines, or a multiplicity of conventional circuit components, particularly where relatively long delay intervals are required of the order of several seconds.

BRIEF DESCRIPTION OF THE INVENTION

I have provided a pulse delay circuit utilizing a minimum of standard circuit components which can readily produce delay times varying from very short intervals to long intervals of the order of several seconds. The delay circuit of the invention provides an output pulse of predetermined width a predetermined time after the input pulse is fed thereto.

The novel circuit incorporates two gate circuits, each gate having an energizing element. A first resistance-capacitance unit is connected between the output of the first gate circuit and one energizing element of the second gate circuit. The time constant of this unit determines the delay period between the input pulse and the production of the output pulse.

A second resistance-capacitance unit is connected between the output of the second gate circuit and an electronic switch incorportated in the output circuit. The time constant of this unit controls the width of the output pulse.

The output of the second gate circuit is fed back to an energizing element of the first circuit to maintain it in energized condition following the time of application of the input pulse. In similar fashion, a voltage from the switch unit of the output circuit is fed back to an energizing element of the second gate circuit to maintain it in actuated condition after the initiation of the output pulse. These feedback elements cooperate with the gate circuits to sequentially charge and discharge the capacitances in the resistance-capacitance units so as to provide the desired delay period and desired width of the output pulse.

It is a feature of the invention that the second gate circuit can include two transistors connected in the Darlington configuration. In this fashion, the first resistance-capacitance unit can include a condenser of relatively low capacitance connected to a high resistance. This permits the transistors to operate well within their saturation range and makes the circuit insensitive to the transistor characteristics while yet permitting a large time constant to be obtained.

DETAILED DESCRIPTION OF THE INVENTION

Figure 2:
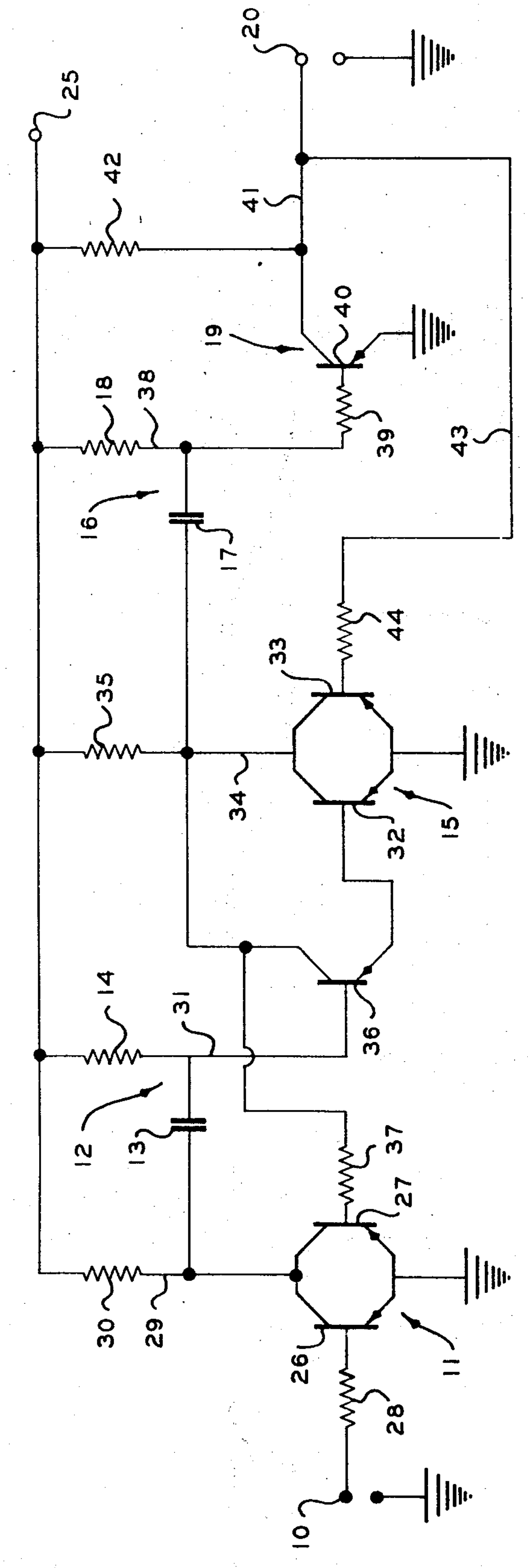
Figure 1:
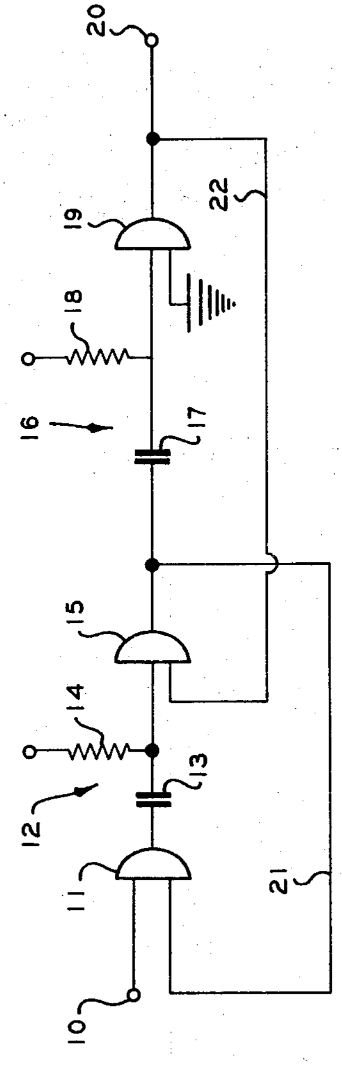

The invention will be more fully understood from the following detailed description taken in conjunction with the appended drawings, in which:

FIG. 1 is a schematic circuit diagram of the pulse delay circuit utilizing symbolic logic elements; and FIG. 2 is a schematic circuit diagram of the pulse delay circuit of the invention.

Referring now to FIG. 1, the circuit includes an input terminal 10 connected to an energizing element of a gate circuit 11. This circuit is energized when an input is fed to either or both of its energizing elements.

The output of the gate 11 is fed to a first resistance-capacitance unit 12 comprising a condenser 13 and a resistance 14. This unit, in turn, is connected to one energizing element of a second gate 15, similar to the circuit 11. The output of the circuit 15 is fed to a second resistance-capacitance unit 16 comprising a condenser 17 and a resistance 18. The output of the unit 16 is fed to an output circuit 19 which is a gate circuit functioning as an inverter. The output of the circuit 19 appears at an output terminal 20.

A lead 21 feeds back the output of the gate 15 to the second energizing element of the gate circuit 11, and a conductor 22 feeds back the output of the circuit 19 to the second energizing element of the gate circuit 15.

In operation, the condenser 13 is initially charged and the condenser 17 is discharged. The gate circuits 15, 19 and energized and the circuit 11 is deenergized. When a pulse is fed to the input terminal 10, the gate circuit 11 is energized and a pulse is transmitted to the gate circuit 15 causing it to become deenergized. This initiates charging of the condenser 17, and the voltage fed back by the conductor 21 maintains the gate circuit 11 in energized condition after the input pulse is terminated. Thereupon, the condenser 13 starts to discharge through the resistance 14.

After a desired delay period determined by the values of the condenser 13 and resistance 14, the resulting voltage at the energizing element of the gate circuit 15 causes it to become energized again. The condenser 17 discharges through resistance 18, causing the gate 19 to become deenergized. This causes an output pulse to be initiated at the terminal 20. The voltage fed back through the conductor 22 maintains the gate circuit 15 in energized condition until the output pulse is terminated. The last described energization of the circuit 15 removes the feedback input to the circuit 11 and again causes it to become deenergized, thus initiating recharging of the condenser 13.

When the gate circuit 15 is energized, the condenser 17 starts to discharge through the resistance 18 at a rate determined by the values of the condenser 17 and resistance 18. After a predetermined period, the resulting change in voltage energizes the circuit 19 and terminates the output pulse.

This removes the feedback signal applied through the conductor 22 to the second energizing element of the gate circuit 16. This circuit is maintained in energized condition, however, by the voltage now present at the output of the condenser 13. Thus, the circuit is restored to its initial condition with the circuit 11 deenergized, the circuits 15, 19 energized, the condenser 13 charged and the condenser 17 discharged.

It will be apparent that the action of the circuit, when supplied with an input pulse, is to initiate an output pulse at a predetermined time interval determined by the time constant of the resistance-capacitance unit 12. Moreover, the width of the output pulse is determined by the time constant of the resistance-capacitance unit 16.

Preferably and advantageously, the gate circuits 11, 15 and 19 are of the dual transistor type. Type NPN transistors are utilized if the collectors are connected to a positive terminal of the power source while PNP-type transistors are utilized if the collectors are connected to the negative power supply terminal. Those skilled in the art will understand that vacuum tubes may be utilized in the gating circuits instead of transistors.

In FIG. 2, I have schematically indicated a complete circuit represented by the logic diagram of FIG. 1, this circuit employing Type PNP transistors so that the voltage appearing at a supply terminal 25 is negative while the voltage represented by the ground signal is positive. Parts corresponding to those described in connection with FIG. 1 are indicated by like reference numerals. In describing the circuit, the term "low" represents ground potential and the term "high" means "not ground" which in this case is a negative potential.

Referring now to FIG. 2, the gate circuit 11 is defined by two Type PNP transistors 26, 27 connected in parallel. The base of the transistor 26 is connected through a fixed resistance 28 to the input terminal 10. The interconnected emitters are grounded and the interconnected collectors are connected by a lead 29 and a resistance 30 to the terminal 25.

The lead 29 is connected to one terminal of the condenser 13, the other terminal of which is connected by a lead 31 and the resistance 14 to the terminal 25. The condenser 13 and resistance 14 define the resistance-capacitance unit 12 described in connection with FIG. 1.

The second gate circuit 15 is, like the circuit 11, defined by a pair of transistors 32 and 33, the interconnected emitters of which are grounded and the interconnected collectors of which are connected by a lead 34 and a resistance 35 to the terminal 25. The base of the transistor 32 is connected to the emitter of a transistor 36, the base of which is connected to the conductor 31 and the collector of which is connected to the conductor 34. Thus, the transistors 32, 36 are connected in the Darlington configuration and the output of the resistance-capacitance unit 12 is impressed through the transistor 36 upon the base or energizing element of the transistor 32.

The output of the circuit 15 is fed back through the conductor 34 and a resistor 37 to the base of the transistor 27, which constitutes the second energizing element of the circuit 11.

The output of the circuit 15 is further impressed upon the condenser 17 by the conductor 34 and the other terminal of the condenser 17 is connected to a conductor 38 which leads through the resistance 18 to the terminal 25. The condenser 17 and resistance 18 make up the second resistance-capacitance unit 16.

The output of the unit 16 is fed to the output circuit 19 where it is impressed through a resistance 39 upon the base or energizing element of a transistor 40. The emitter of the transistor 40 is grounded, and the collector thereof is connected by a lead 41 to the output terminal 20. The collector is further connected by a resistance 42 to the terminal 25 and by a feedback conductor 43 and a resistance 44 to the base of the transistor 33, which constitutes the second energizing element of the gate circuit 15. The operation is similar to that described in connection with FIG. 1. Initially, the condenser 13 is charged, the condenser 17 is discharged, the gate circuits 15, 19 are energized, and the circuit 11 is deenergized. The circuit 15 is energized by the high potential in the lead 31 which is impressed through the transistor 36 upon the base of the transistor 32.

When an input pulse is impressed upon the terminal 10, the resulting high voltage at the base of the transistor 26 energized the circuit 11 so that the collectors of the transistors 26, 27 change from high to low potential. The resulting pulse is transmitted through the transistor 36 to the base of the transistor 32, thus deenergizing the circuit 15. The resulting high potential at the conductor 34 initiates charging of the condenser 17 and impresses a high signal upon the base of the transistor 27, thus locking the circuit 11 in energized condition.

Thereupon, the condenser 13 begins to discharge through the resistance 14. After a predetermined time, determined by the constants of the condenser 13 and resistance 14, the change in potential at the base of the transistors 36 and 32 again energizes the circuit 15. The resulting pulse appearing at the conductor 34 deenergizes the transistor 40 of the output circuit 19, and causes initiation of a high pulse at the output terminal 20. The described energization of the circuit 15 produces a low voltage at the base of the transistor 27, thus deenergizing the circuit 11 and initiating the recharging of the condenser 13. It should be noted that no input pulse is present at the terminal 10 at this time so that the bases of the transistors 26, 27 are both at low potential.

The described deenergization of the transistor 40 impresses a high potential through the feedback conductor 43 upon the base of the transistor 33, thus causing this circuit to remain energized for the duration of the output pulse.

The condenser 17 starts to discharge through the resistance 18 when the output pulse is initiated. After a predetermined period, determined by the constants of the condenser 17 and resistance 18, the potential change at the base of the transistor 40 causes it to become energized, thus terminating the output pulse. Thereupon, the feedback voltage impressed upon the base of the transistor 33 is cut off, but the circuit 15 remains energized by the potential impressed upon the base of the transistor 32 through the transistor 36 and conductor 31.

It will be apparent that I have achieved the objects of my invention in providing a pulse delay circuit incorporating a minimum number of standard components. The start of the output pulse is delayed a predetermined interval from the time when the input pulse is received, this interval being determined by the time constant of the resistance-capacitance unit 12. Moreover, an output pulse of predetermined width is produced, and this width is controlled by the time constant of the resistance-capacitance unit 16.

In one practical embodiment of the pulse delay circuit the resistors 30, 35 and 42 had a value of 1200 ohms while the resistors 28, 37, 44 and 39 had a value of 12,000 ohms. With these values, the ratio of maximum collector current to maximum base current is 10, giving a maximum base current of 1.0 milliampere and a maximum collector current of 10 milliamperes with a 12-volt source. This ensures transistor operation under saturated conditions, that is, that the base current is higher than the linear range under these conditions, the circuit is insensitive to the transistor characteristics, and the transistors themselves act as switches rather than amplifiers.

In a typical embodiment of the circuit of FIG. 2, the condenser 13 had a value of 1 microfarad and the resistance 14 had a value of 5 megohms, giving a time constant of 5 seconds. The condenser 17 had a value of 5,000 microfarad and the resistance 18 had a value of 5,000ohms, giving a time constant for the unit 16 of 5 milliseconds.

It is a feature of the invention that the transistors 32, 36 are connected in the Darlington configuration. This permits the resistance 14 to have a high value and the condenser 13 to have a relatively small value so that a condenser of reasonable size can be employed such that a high time constant can still be obtained. Without the provision of the transistor 36, it would be difficult to obtain a high time constant and still operate the transistor 32 under conditions of saturation. It will be evident from the foregoing that the transistor 36 can be omitted in the broader aspects of the invention where only a relatively short delay is needed. In this case, the conductor 31 is attached directly to the base of the transistor 32.

The circuit as described has been found to give excellent results in providing time delays in a data process system for seismic records. It will be evident that I have achieved the objects of the invention in providing a very flexible pulse delay circuit utilizing a minimum number of standard circuit components.

Other variations and modifications of this invention will be apparent to those skilled in the art without departing from the spirit and scope of the invention.

I claim:

1. A pulse delay circuit comprising, in combination, a first set and a second set of first and second parallel connected transistors; an output transistor; each of said transistors having a base, a collector, and an emitter; a first condenser connecting the collectors of said first set of transistors to the base of the first one of said second set of transistors, a first resistance arranged to discharge said condenser; a second condenser connecting the collectors of said second set of two transistors to the base of said output transistor; a second resistance arranged to discharge said second condenser; means for applying an input pulse to the base of the first one of said first set of two transistors; means for feeding back the output of said second set to the base of the second transistor of said first set; means for feeding back the output signal from the collector of said output transistor to the base of the second transistor of said second set; means for connecting the emitters of said first set of transistors to a reference voltage; means for connecting the emitters of said second set of transistors to a reference voltage; and means for connecting the emitter of said output transistor to a reference voltage.

2. The circuit of claim 1 wherein the time constant of said first condenser and said first resistance is substantially greater than the time constant of said second condenser and said second resistance.

3. The circuit of claim 1 further comprising a sixth transistor having its base connected to said first condenser, its emitter connected to the base of the first transistor in said second set of transistors and its collector connected to the collectors of said second set of transistors, said sixth transistor being connected in the Darlington configuration with the first transistor of said second set.